United States Patent
Wank et al.

(10) Patent No.: US 9,880,228 B2
(45) Date of Patent: Jan. 30, 2018

(54) METHOD AND SYSTEM FOR MEASURING THE INTEGRITY OF A POWER CONVERTER

(75) Inventors: Norbert H. Wank, Plano, TX (US); David H. Friedman, Austin, TX (US)

(73) Assignee: InfiniRel Corporation, San Jose, CA (US)

( * ) Notice: Subject to any disclaimer, the term of this patent is extended or adjusted under 35 U.S.C. 154(b) by 700 days.

(21) Appl. No.: 13/993,301

(22) PCT Filed: Dec. 12, 2011

(86) PCT No.: PCT/US2011/064476
§ 371 (c)(1),
(2), (4) Date: Jun. 11, 2013

(87) PCT Pub. No.: WO2012/082648
PCT Pub. Date: Jun. 21, 2012

(65) Prior Publication Data
US 2013/0282313 A1    Oct. 24, 2013

Related U.S. Application Data

(60) Provisional application No. 61/422,194, filed on Dec. 12, 2010.

(51) Int. Cl.
*G01R 31/40* (2014.01)
*G01R 31/42* (2006.01)
*H02M 7/48* (2007.01)

(52) U.S. Cl.
CPC ............. *G01R 31/40* (2013.01); *G01R 31/42* (2013.01); *H02M 7/48* (2013.01)

(58) Field of Classification Search
CPC ......... G01R 31/40; G01R 31/42; H02M 7/48; H02J 3/01; H02J 3/381; H02J 7/0075; H02J 9/062; Y02E 40/40; Y10T 307/62
(Continued)

(56) References Cited

U.S. PATENT DOCUMENTS 5,982,160 A * 11/1999 Walters ................. H02M 3/156
323/222
7,512,825 B2    3/2009 Winick et al.
(Continued)

FOREIGN PATENT DOCUMENTS

WO    2010111412 A2    9/2010

OTHER PUBLICATIONS

International Search Report and Written Opinion dated May 16, 2012 for PCT Patent Application No. PCT/US2011/064476, 9 pages.
(Continued)

*Primary Examiner* — John H Le
(74) *Attorney, Agent, or Firm* — Hayne Boone, LLP; Greg Webb; David Pittman

(57) ABSTRACT

A method of measuring integrity of a pulse-width modulated power converter may include the steps of monitoring data associated with an input and an output of the power converter. Then correlating the data to identify degradation in performance of the power converter. A system for measuring integrity of a pulse-width modulated power converter. Current sensors may sense input and output currents of the power converter. A programmable controller may be loaded with an integrity measuring algorithm that may analyze data from the current sensors. An impending failure of the power converter may be indicated as a result of the analysis of the data.

25 Claims, 8 Drawing Sheets

(58) Field of Classification Search
USPC .............. 702/58, 60, 61, 64, 185; 361/1, 78;
379/24; 713/340
See application file for complete search history.

(56) References Cited

U.S. PATENT DOCUMENTS

| | | |
|---|---|---|
| 2005/0135031 A1* | 6/2005 | Colby ....................... H02J 3/42 361/78 |
| 2007/0121795 A1 | 5/2007 | Buskmiller et al. |
| 2008/0285184 A1 | 11/2008 | Phadke et al. |
| 2010/0161259 A1 | 6/2010 | Kim et al. |
| 2012/0116696 A1* | 5/2012 | Wank ..................... G01R 31/42 702/58 |

OTHER PUBLICATIONS

Aeloíza et al., "A Real Time Method to Estimate Electrolytic Capacitor Condition in PWM Adjustable Speed Drives and Uninterruptible Power Supplies", 2005, 6 pages.

Friedman, David H., Wank, Norbert H., Garnett, Mark; "Method and system for non-intrusive measurement of the integrity of an electrical apparatus connected to a power grid," Provisional Patent Disclosure, Plano, TX, Dec. 12, 2010, 5 pages.

* cited by examiner

METHOD AND SYSTEM FOR MEASURING THE INTEGRITY OF A POWER CONVERTER

CROSS-REFERENCE TO RELATED APPLICATIONS

This application is a national stage under 35 USC 371 of International Application No. PCT/US11/64476, filed on 12 Dec. 2011, which claims priority to a Provisional Application No. 61/422,194, filed on 12 Dec. 2010. The entire disclosures of these prior applications are incorporated herein by this reference.

TECHNICAL FIELD

The present disclosure relates generally to electronic power converters and, in an embodiment described herein, more particularly provides a system and method for non-intrusively detecting degradation in power output quality from power conversion equipment, thereby predicting impending failures in the power conversion equipment.

BACKGROUND

Failures in power conversion systems, such as power converters failing while producing power to a power grid, can cause emergency situations by removing a power source to the power grid with minimal warnings. Emergencies (e.g. unanticipated maintenance, power loss, etc.) can be very expensive for both power customers and power companies. Minimizing on-grid failures could reduce emergency maintenance expenses, allow more efficient spare parts ordering and storage, reduce power grid outages, etc. Therefore, it can readily be seen that improvements to the art of power conversion systems is needed.

SUMMARY

In carrying out the principles of the present disclosure, a method and system is provided which brings improvements to the art of power conversion. One example is described below in which a method of measuring integrity of a pulse-width modulated power converter may include the steps of monitoring data associated with an input and an output of the power converter. Then correlating the data to identify degradation in performance of the power converter and indicate impending failures of the power converter. Another example is described below in which a system for measuring integrity of a pulse-width modulated power converter is provided. The system may include a power converter and current sensors that sense input and output currents of the power converter. A programmable controller may be loaded with an integrity measuring algorithm that may analyze data from the current sensors. An impending failure of the power converter may be indicated as a result of the data analysis.

These and other features, advantages and benefits will become apparent to one of ordinary skill in the art upon careful consideration of the detailed description of representative embodiments of the disclosure below and the accompanying drawings, in which similar elements are indicated in the various figures using the same reference numbers.

DETAILED DESCRIPTION

Generally there are four types of power conversions, as given in the table below.

| Topology | Input | output | Typical Application |
| --- | --- | --- | --- |
| inverter | DC | AC | PV solar, wind turbines, AC-motor (Variable-Speed) drives |
| DC-DC converter | DC | DC | telecom and data-center power, servers, battery chargers |
| frequency converter | AC | AC | light-rail, heavy rail (locomotive), air-planes, military weapon systems |
| rectifier | AC | DC | wind-turbines, electric vehicles (regenerative breaking) |

A power converter that converts DC power to AC power is normally referred to as an inverter. A DC-DC power converter generally converts from one DC voltage to another DC voltage. A frequency power converter generally converts AC power at one frequency to AC power at another frequency. A power converter that converts AC power to DC power is generally referred to as a rectifier. The principles of this disclosure may be used with any of these four ways of power conversion to indicate impending failures in a power converter.

Figure 1:
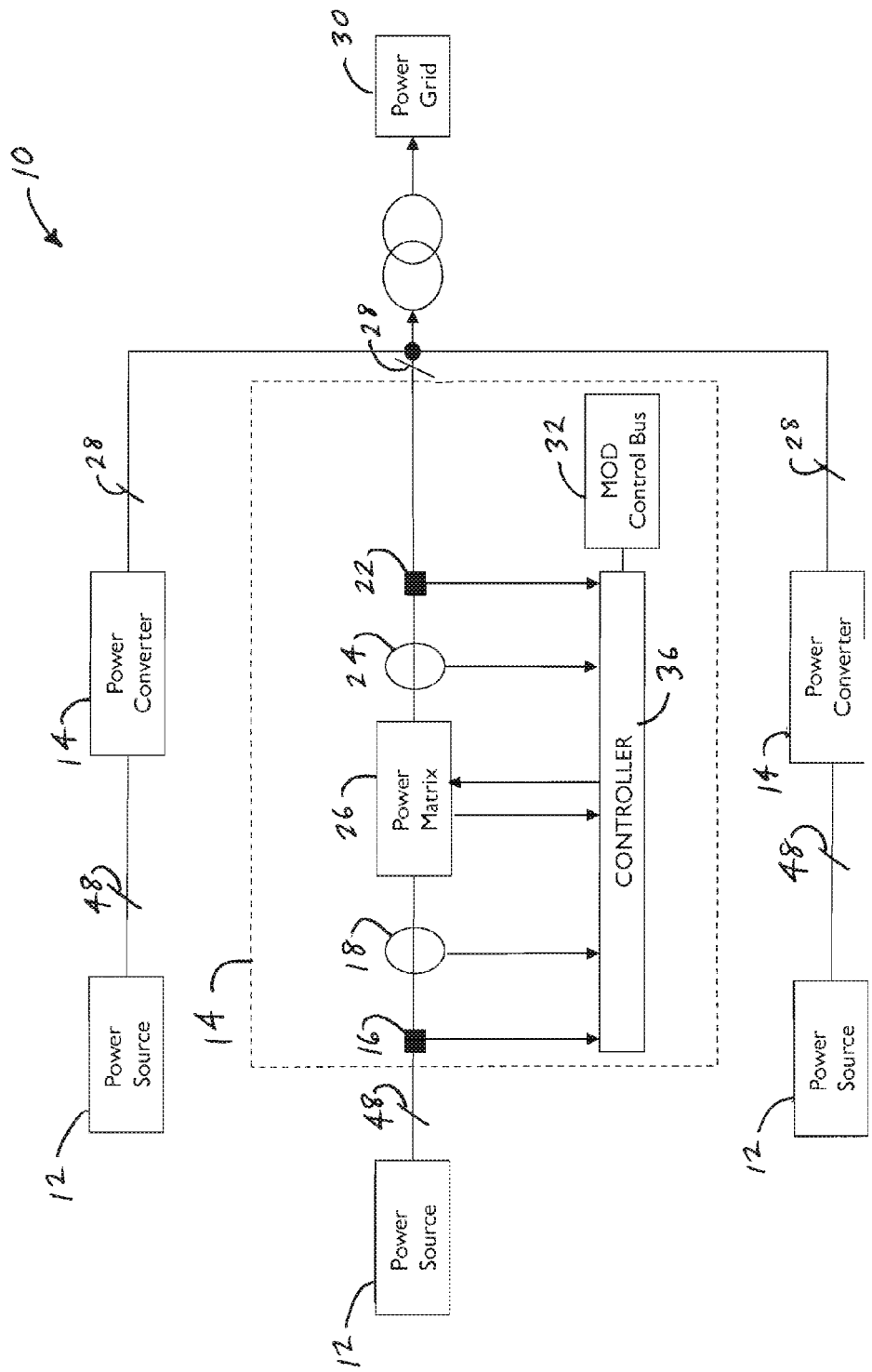
FIG. 1 is a representative block diagram of a prior art power conversion system which may benefit from the principles of the present disclosure.

Representatively illustrated in FIG. 1 is a prior art power conversion system 10 which can benefit from the principles of this disclosure. The power conversion system may include a power source 12 that supplies AC and/or DC power to the inputs 48 of a power converter 14. The power source 12 may include multiple sources 12 (FIG. 1) or the power source 12 may be connected in parallel with an input 48 of each power converter 14 such that each power converter receives power from the single power source 12.

Each power converter 14 may convert the input power it receives to another power on its outputs 28 by converting the voltage levels, frequencies, etc. and outputting the resulting power to a power grid 30. This power grid 30 may be a national power grid, such as the power grid used in the United States to distribute power to businesses and individual customers. However, the power grid 30 may be a local power grid, such as a local power bus to a Variable Speed Driver for an AC motor in an Electric Vehicle.

FIG. 1 shows multiple power converters 14 connected in parallel with the power grid 30. However, it is not necessary that the converters 14 be connected to a single power grid 30. For example, each of the converters 14 may be connected to a separate power grid 30. Additionally, some of the power converters 14 may be connected in parallel and supplying power to one power grid 30 while other power converters 14 are connected individually to separate power grids 30. Therefore, it can readily be seen that any size power grid 30 may be used and that multiple configurations of connecting inputs 48 and/or outputs 28 of the power converters 14 may be employed in keeping with the principles of this disclosure.

FIG. 1 shows a representative block diagram of the power converter 14. A controller 36 may be used to regulate the outputs 28 of the power converter 14 by measuring its input/output voltages and input/output currents with appropriate sensors 16, 18, 22, 24. Sensor data is provided to the controller 36 through conventional analog-to-digital (A/D) converters. Current sensors 18 and 24 may provide input and output current measurements, respectively. Voltage sensors 16 and 22 may provide input and output voltage measurements, respectively. The controller 36 may control a power matrix 26 to convert power from the power source 12 to the power grid 30. The controller 36 also may provide communication to an external control system via the MOD control bus 32.

The A/D converters may be provided in the power converter 14 along with the controller 36 when purchased from a manufacturer. These sensors and A/D converters usually provide a sampling frequency in a range of approximately 80 kHz-250 kHz which provides sufficient data to the controller 36 for adequately controlling the power conversion. However, these sampling frequencies are generally too slow for implementing the principles of this disclosure.

Figure 2:
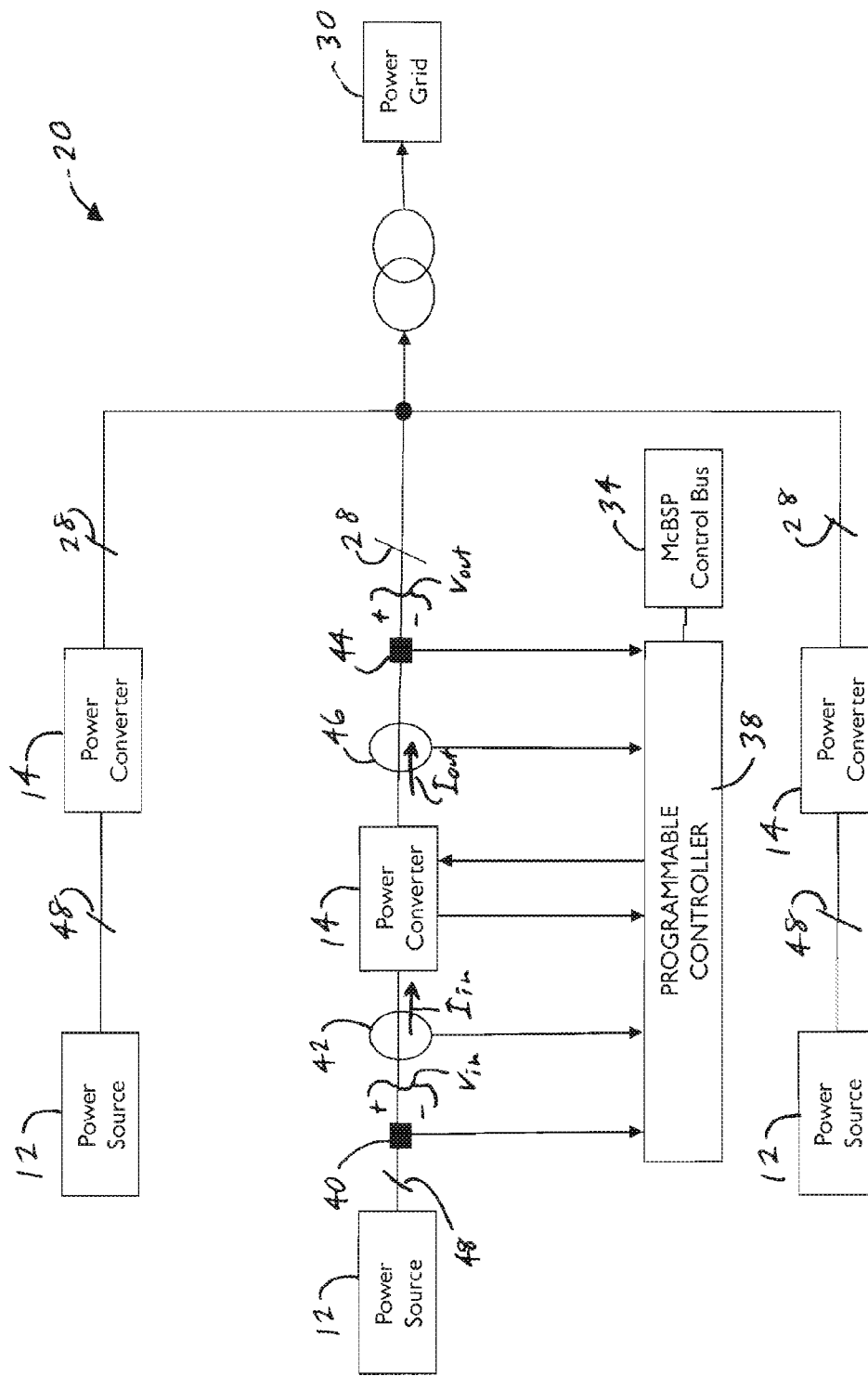
FIG. 2 is a representative block diagram of a power conversion system which embodies principles of the present disclosure.

Referring now to FIG. 2, an example power conversion system 20 that embodies principles of this disclosure is shown. As in FIG. 1, the power source 12 may be multiple sources, a single source, a single source feeding multiple power converters, etc. Also the power converters 14 may be connected in parallel to the power grid 30, connected to individual power grids 30, etc.

FIG. 2 differs from FIG. 1 in that additional voltage sensors 40, 44 and current sensors 42, 46 are placed on the inputs and outputs of the power converter 14. FIG. 2 shows that only one of the power converters is outfitted with additional sensors 40, 42, 44, 46, however, it can readily be seen that any of the power converters 14 may be configured to incorporate the additional sensors. These sensors 40, 42, 44, 46 provide higher sampling frequencies than those of FIG. 1, and a programmable controller 38 includes high-speed A/D converters for converting data from the sensors 40, 42, 44, 46 into digital information for use by the programmable controller 38. It may also be readily seen that multiple of these sensors may be used to provide redundancy, increase bandwidth of data collection, etc.

For a power conversion system 20 with a power output frequency of 60 Hz, the desired sampling frequencies for the sensors 40, 42, 44, 46 and A/D converters are greater than 250 kHz, and are preferably 1 MHz. It is not a requirement that the sampling frequencies be greater than 250 kHz. The sampling frequencies may be increased or decreased as needed to accommodate power conversion systems 20 with either higher or lower power output frequencies (e.g. 400 Hz systems for aircraft, 50 Hz for non-US power grids, etc.) in keeping with the principles of this disclosure.

These sampling frequencies should be a frequency that provides the programmable controller 38 with visibility into signals within the power conversion system 20. The programmable controller 38 can analyze and detect anomalies in these signals, where the anomalies indicate impending failures of the power converter 14.

The programmable controller 38 is loaded with an integrity measuring algorithm 50 (FIGS. 3, 4) that reads the sensor data from sensors 40, 42, 44, 46, correlates the data, and produces an equivalent series resistance (ESR) value 72 from the correlated data. The calculated ESR value 72 may be used to identify anomalies which indicate impending failures of the power converter 14. For example, if the calculated ESR value 72 is significantly larger than the ESR value of an input capacitor of a similar power converter 14, then this may indicate that the input capacitor is going to fail soon.

Additionally, if the value 72 is recorded as a function of time (e.g. strip chart recording, digital recording, etc.) and oscillations are detected on the recording. These oscillations may indicate a problem with a software control program, an input capacitor, an insulated gate bipolar transistor, an inductor, a MOSFET device, a bridge switch, etc. of the power converter 14.

The voltage sensor 40 reads a value of an input voltage Vin on an input 48 of the power converter 14. The current sensor 42 reads a value of an input current Iin being transferred through input 48 into the power converter 14. The voltage sensor 44 reads a value of an output voltage Vout on an output 28 of the power converter 14. The current sensor 46 reads a value of an output current Iout being transferred through output 28 from the power converter 14.

Figure 3:
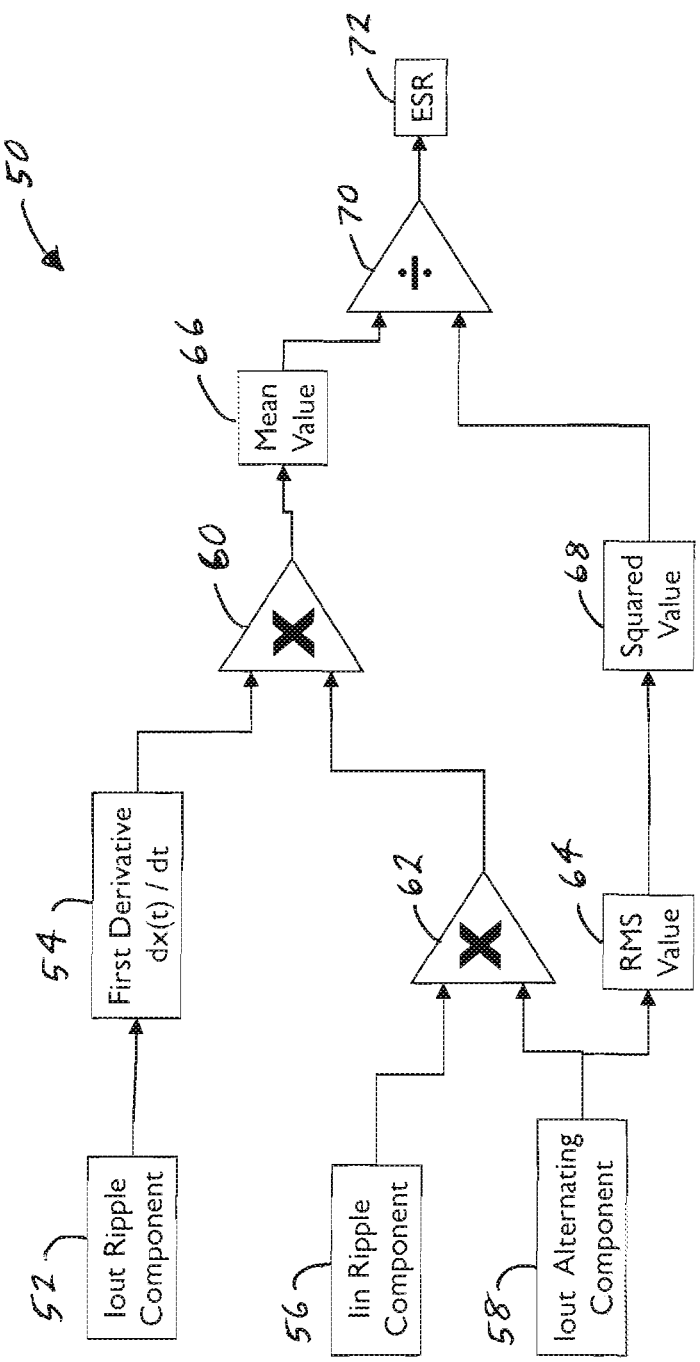
FIG. 3 is a representative block diagram of an algorithm which calculates an equivalent series resistance.

Referring now to FIG. 3, a block diagram of the integrity measuring algorithm 50 is shown. In this version of the algorithm 50, the ESR value 72 is calculated from three inputs 52, 56, 58 which are delivered to the programmable controller 38. The sensors 40, 42, 44, 46 are sampled at a sampling frequency (e.g. 1 MHz) and the instantaneous value of each sample is provided to programmable controller 38 via the high-speed A/D converters.

Each of the resulting signals Iin, Vin, Iout, Vout include an alternating component and a ripple component. The alternating component is the base frequency of the power system 20. For example, the alternating component would be 60 Hz for a 60 Hz power system 20 and it would be 50 Hz for a 50 Hz power system 20. The ripple component is that part of the signal that represents a charging and discharging of a capacitor. The ripple component may be similar to a saw-tooth waveform when separated from the alternating component.

A detrending function may be used to separate the alternating component from the ripple component. As seen in FIG. 3, a ripple component of the output current Iout is calculated in step 52 of the algorithm 50. The Iout ripple is then output to step 54 where a first derivative (e.g. first difference $(x(n+1)-x(n))/(t(n+1)-t(n))$) of the Iout ripple signal is calculated. In step 56, a ripple component of the input current Iin is calculated and output to step 62. In step 58, the alternating component of the output current Iout is calculated (i.e. the ripple component is removed) and then the alternating component is output to the step 62.

The step 62 multiplies the results of steps 56 and 58 and then outputs the resulting product to a multiplier step 60. Step 64 calculates an RMS value of the output current Iout alternating component result from step 58 and then step 68 calculates a square of the RMS value from step 64. Step 68 squares the RMS value from step 64 and presents the result to step 70.

The step 60 multiplies the results of steps 54 and 62 and then outputs the resulting product to step 66 where a mean value is calculated. Step 66 outputs the mean value to step 70 where the mean value is divided by the squared RMS value from step 68. The output of the step 70 is the equivalent series resistance value 72. The calculated ESR value 72 is used to indicate impending failures of the power converter 14.

A beneficial aspect of the algorithm 50 in FIG. 3 is that only the input and output currents Iin, Iout need to be sensed to provide indications of impending failures of the power converter 14. The calculated ESR value 72 from the algorithm of FIG. 3 may have a larger error tolerance of other implementations of the algorithm 50, but it does provide indications of impending failures of the power converter 14.

Figure 4:
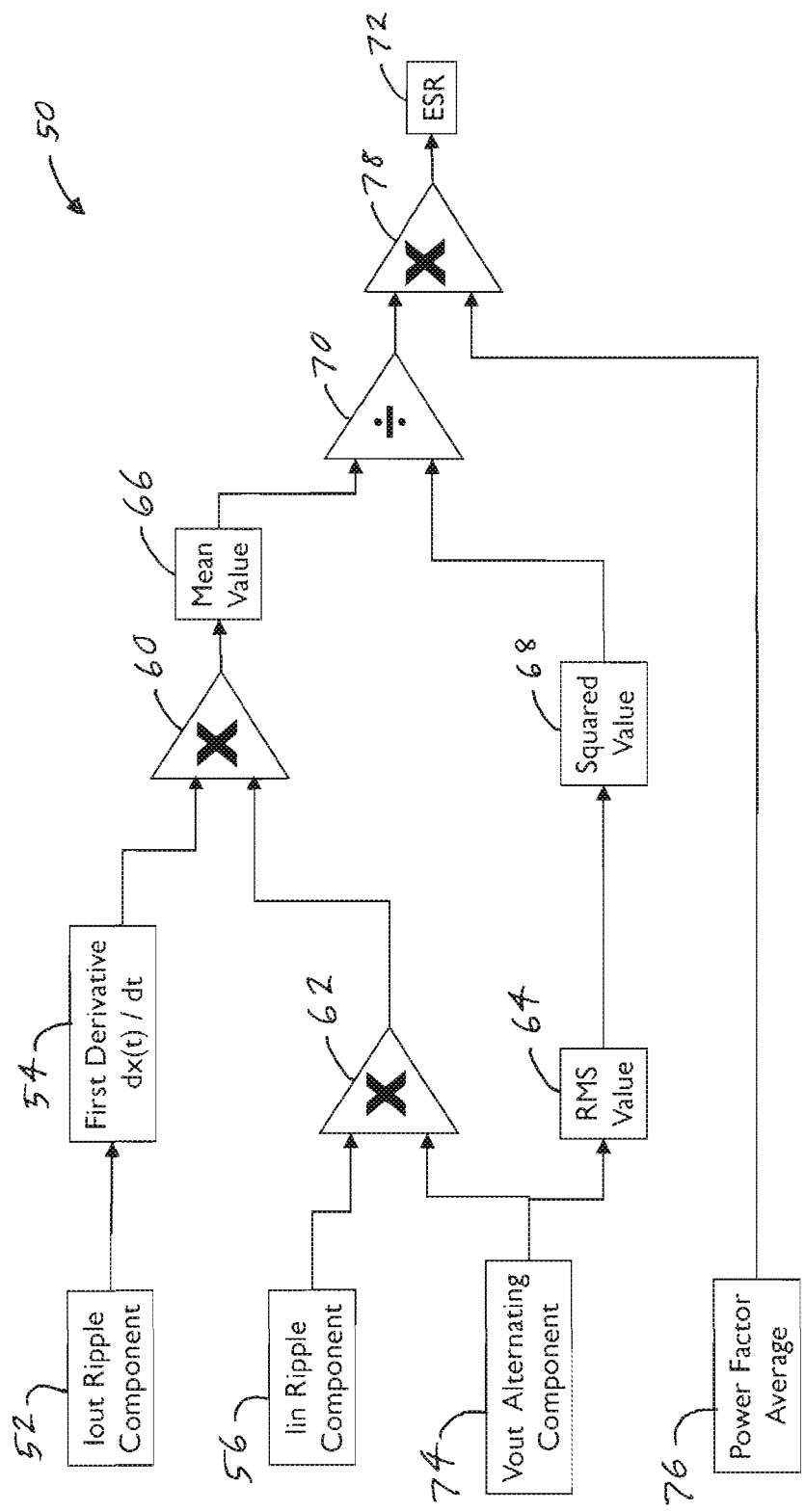
FIG. 4 is a representative block diagram of another algorithm which calculates an equivalent series resistance.

Another implementation of the algorithm 50 is shown in FIG. 4. This implementation produces an ESR value 72 with tighter error tolerances and is capable of more accurate results than the implementation of FIG. 3. FIG. 4 is very similar to FIG. 3 except for a few important differences. Generally, the differences are that step 58 has been replaced by step 74, and steps 76 and 78 have been added.

In step 74, the alternating component of the output voltage Vout is calculated by removing the ripple component from the output voltage signal (in step 58 of FIG. 3 the alternating component of the output current Iout was calculated). The step 76 calculates an average of a power factor between the output voltage Vout and current Iout. The result of step 76 is input into step 78. Step 78 multiplies the output of step 76 with the output of step 70. The resulting product is the calculated ESR value 72.

Other scaling and sign manipulations can be added to the algorithm 50 while continuing to provide an ESR value 72 which provides indications of impending failures of the power converter 14. Therefore, it can readily be seen that several variations of the algorithm 50 are possible in keeping with the principles of the current disclosure.

Figure 5:
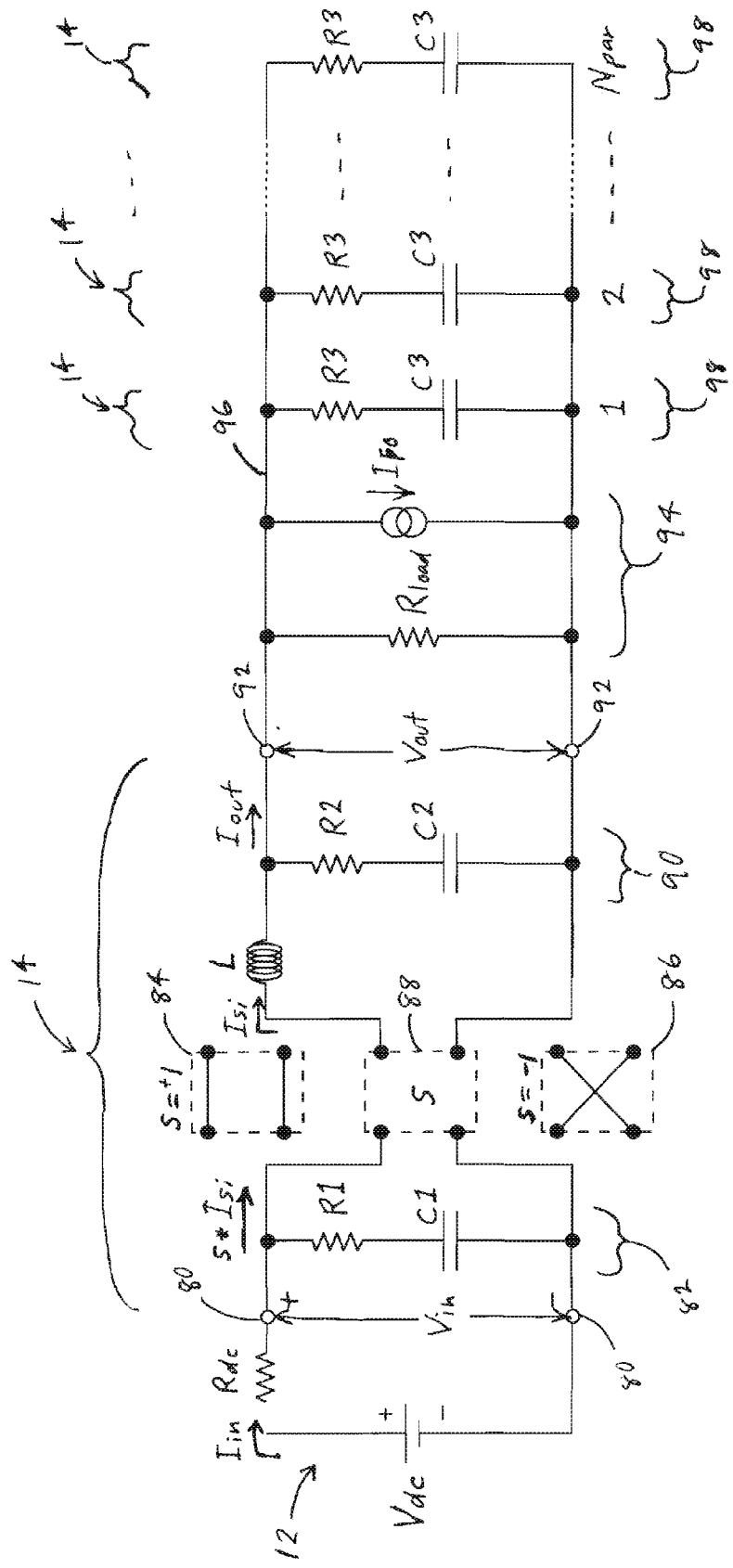
FIG. 5 is a schematic representation of electrical components of a power converter.

Referring now to FIG. 5, an example of the power converter 14 is disclosed to aid in a more detailed understanding of an implementation of the algorithm 50. However, it must be understood this is merely an example of the power converter 14 and algorithm 50 and in no way limits the principles of this disclosure.

FIG. 5 shows an equivalent circuit for the power converter 14 (which in this example is an inverter) plus a power source 12 and an output load Rload. The power source 12 is represented by a DC voltage source Vdc and a DC resistance Rdc. The power source 12 may be connected to input terminals 80 of the power converter 14, with an input voltage Vin and an input current Iin. A DC link capacitor 82 is represented as C1 and R1.

A bridge switch 88 is a switch that alternates between a straight-thru connection 84 and a crossed-over connection 86 between the inputs and outputs of the switch 88. The state of the bridge switch 88 is represented by the value of a variable S which represents the instantaneous state of the switch: S=1 for the straight-thru connection 84 and S=−1 for the crossed-over connection 86. A current Isi is the current passing through an energy storage inductor L which is on an output side of the bridge switch 88. A corresponding current on an input side of the bridge switch 88 is shown as the product of the variable S and the inductor current Isi (=S*Isi). Therefore, the bridge switch 88 input current value alternates between Isi and −Isi depending on the switch state (i.e. the value of S).

A capacitor C2 and resistor R2 represent an output capacitor 90, where an output voltage Vout and an output current Iout is output from the power converter 14. A power converter load 94 is represented by a resistive load component Rload, a current source Ifo for forcing an optional inductive load current component, and additional power converters 14. The additional power converters 14 are shown numbered 1, 2, . . . Npar, and are paralleled on an output bus 96 connected to the output terminals 92 of the power converter 14. Each additional power converter 14 is represented by a capacitor C3 connected in series with a resistor R3.

Figure 6:
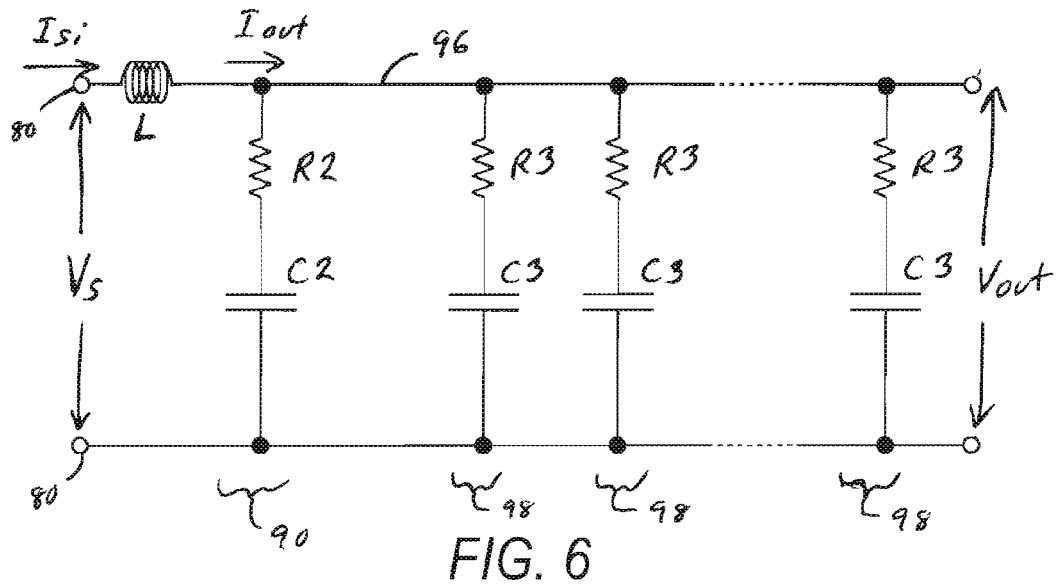
FIG. 6 is a schematic representation of output circuitry of the power converter.
Figure 6A:
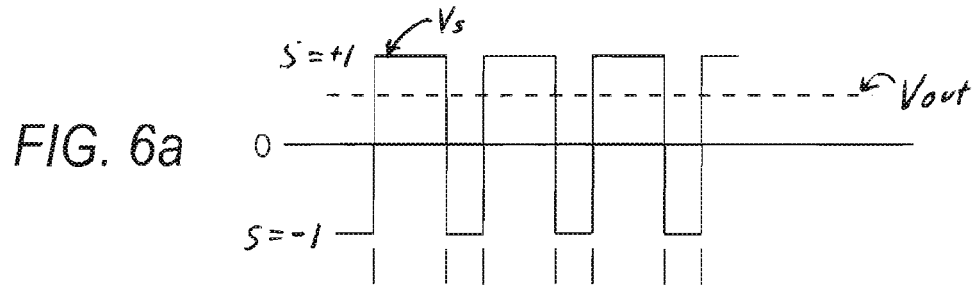
FIGS. 6a-c are waveforms of parameters of the power converter and an integrity measuring algorithm.

The current Isi through the inductor L can be determined as a time-integral of a voltage across the inductor L. As seen in FIG. 6, this voltage is the difference between a source voltage Vs (where Vs=S*Vin) and the output voltage Vout. Referring now to FIG. 6a, a short interval of time consisting of a few switching cycles is shown, during which an alternating component (60 Hz in this example) of the output voltage Vout changes relatively slowly and may be taken as essentially constant.

Figure 6B:
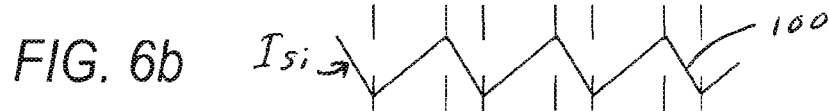

FIG. 6a shows the source voltage Vs and the output voltage Vout plotted vs. time. Since the inductor current Isi is proportional to an integral of the difference between Vs and Vout then a switching-ripple component 100 of the inductor current Isi is as shown in FIG. 6b. Assuming very little of a 60 Hz current flows through the output capacitor, a 60 Hz component of the inductor current Isi (not shown) becomes the 60 Hz load current.

The ripple component 100 is essentially divided between the output capacitor 90 (C2 and R2) and the output capacitors 98 (C3 and R3) of the additional power converters 14. Therefore, the output current Iout includes a ripple component 102 that is approximately Npar/(Npar+1) times that of the inductor current Isi, as seen in FIG. 6c.

Figure 7:
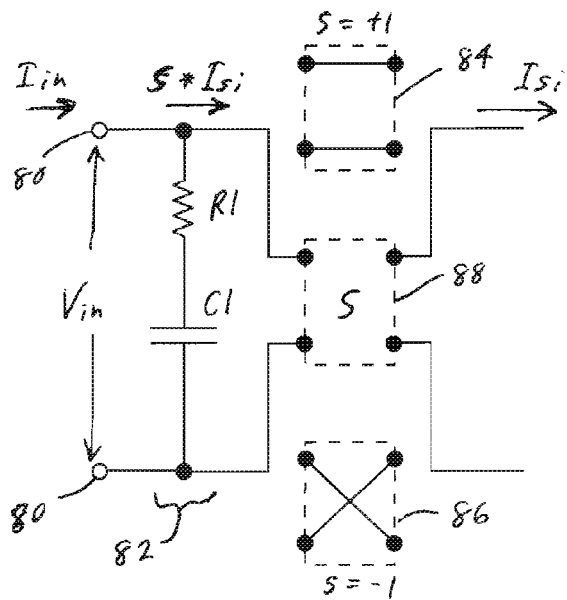
FIG. 7 is a schematic representation of input circuitry of the power converter.
Figure 7A:
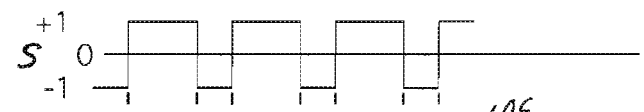
FIGS. 7a-f are waveforms of additional parameters of the power converter and the integrity measuring algorithm.
Figure 7B:
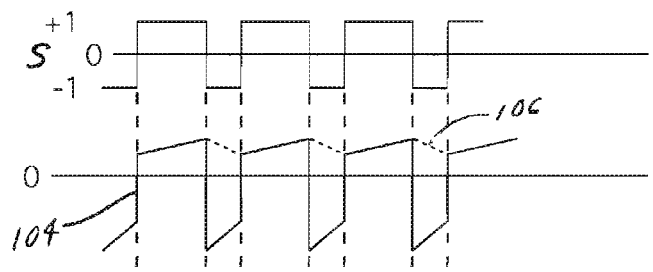

Referring now to FIG. 7, a representative schematic of the circuitry on the inputs 80 of the power converter 14 and a switched inductor current (S*Isi) which flows out of the link capacitor 82. FIG. 7a shows the variable S as a function of time. FIG. 7b shows the switched inductor current 104, which is the inductor current Isi multiplied by the state S of the switching configuration (S*Isi). (note: the dotted lines 106 represent the inductor current Isi without the switching). An RMS value of the switched inductor current is accounted for by the input current Iin.

Figure 7C:
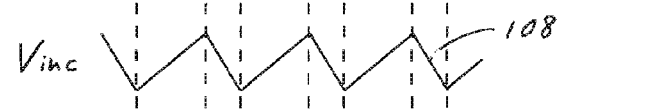
Figure 7D:
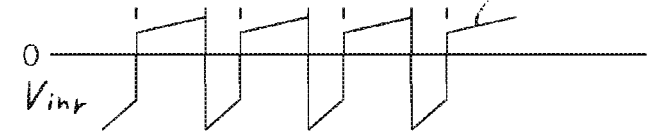

If the resistance Rdc of the power source 12, is high relative to an impedance of the link capacitor 82 at a switching frequency (e.g. 60 Hz), then most of the ripple component of the switched inductor current (S*Isi) flows through the link capacitor 82. This gives rise to a capacitive component Vinc (due to capacitor C1) and a resistive component Vinr (due to resistor R1) in a ripple of the input voltage Vin. FIG. 7c shows the capacitive component Vinc as trace 108. FIG. 7d shows the resistive component Vinr as trace 110. Capacitive and resistive components will also be present in the input current Iin.

Figure 6C:
Figure 7E:
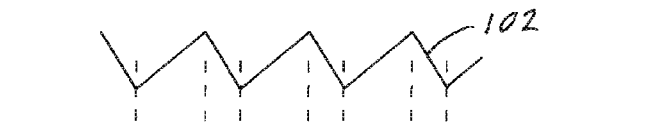
Figure 7F:
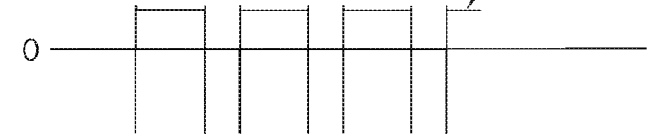

The ripple component 102 of the output current Iout seen in FIG. 6c is reproduced in FIG. 7e for convenience. Note that a first derivative of the ripple component 102 (or a first difference $(x(n+1)-x(n))/(t(n+1)-t(n))$ delta t in a sampled-digital domain), shown in FIG. 7f as trace 112, has the correct timing to correlate with the resistive component Vinr (i.e. trace 110 in FIG. 7d) of the input voltage Vin across the link capacitor 82. A sample-by-sample product of the two traces 110 and 112, summed and averaged over time, produces a nonzero result proportional to R1.

Since the alternating component of the inductor current Isi becomes the alternating component of the output current Iout, a sign of the inductor current Isi changes over the alternating cycle. Therefore it is desirable to compensate for this by including the alternating component of the output current Iout in the sample-by-sample product of the two traces 110 and 112, and dividing by the mean-square of this component in order to scale the result so as to be independent of the magnitude of the output current Iout.

Experimental results from a simulation of the algorithm 50 as shown in FIG. 3 was performed. Using a combination of resistive load Rload and forced inductive load current Ifo (e.g. lagging the output voltage Vout by 90 degrees), the simulation produced ESR values 72 that were substantially constant as a load current magnitude was doubled, even though the ESR values 72 did increase as the load became more inductive. This simulation generated ESR values 72 which were accurate enough to correctly predict impending failures of the power converter 14.

Multiplying the ESR values with the output power factor, which is computed by correlating the alternating components of the output voltage Vout and current Iout, can achieve improved accuracy by compensating for the increase in ESR values 72 due to changes in inductive loading on the output bus 96. The variations due to inductive loading changed can be reduced to a few percent as the power factor is changed from 0.7 to 1. Capacitive loading of the power bus may also be compensated accordingly.

The circuit of FIG. 5 was simulated by using the nodal equations below:

$$Vin*(1/Rdc+1/R1)=Vdc/Rdc+V1/R1-S*Isi$$

$$Vout*(1/Rload+(Npar+1)/R2)=(Npar+1)*V2/R2+Isi-Ifo$$

A circuit state was determined at each sample time according to the following procedure:

1) Determine the current value of S according to the switching frequency with the duty cycle following a 60 Hz sinusoidal function between extremes of e.g. 10% and 90%.

2) Solve the nodal equations, using the current values of V1, V2 and Isi where V1 and V2 are the capacitive voltages across C1 and C2 respectively.

3) Update V1, V2 and Isi for the next sample time according to the currents and voltages obtained from step 2, using:

$$V1'=V1+ts*(Vin-V1)/(R1*C1)$$

$$V2'=V2+ts*(Vout-V2)/(R2*C2)$$

$$Isi'=Isi+ts*(s*Vin-Vout)/Lsi$$

Where ts is the time between samples and the primes (i.e. V1', V2', Isi') indicate the updated values). This kind of simple linear update can introduce errors if the sampling rate is too low; however, with a sampling rate of 240 k/sec and switching frequency of 20 kHz, doubling the sampling rate was found to have negligible effect on the results.

Component values used were:
Sampling rate: 240 k/sec
Switching rate: 20 kHz
Vdc=240 volts
Rdc=10 ohms
C1=1000 µF
R1=0.1 ohm
Lsi=1 mH
C2=1 µF
R2=1.0 ohm
Npar=2

The Vdc value was adjusted as needed to produce the desired 120V RMS output. The R1 value is modified during the simulation as a test parameter to see how the out ESR values 72 track the R1 values. Npar of 2 was chosen which equates to 3 inverters in parallel on the output bus 96.

The simulation was run for 24,000 samples (0.1 sec=6 cycles of 60 Hz). Signals Vin, Iin, Vout, Iout were kept and the 60 Hz and switching-ripple components separated by running a "detrend" function program to subtract the best 3rd-degree polynomial fit to blocks of 200 samples (0.833 msec) with 60-sample overlap, to give the ripple components; subtracting the ripple gave the alternating components (60 Hz in this simulation).

The numerical computation carried out was:
1) at each sample time, take the product of
   (a) ripple component of Iin
   (b) 60 Hz component of Vout
   (c) first difference of ripple component of Iout
2) sum and average the above products
3) multiply the result by the output power factor
4) divide the result by the mean-square of the 60 Hz component of Iout An additional step may be performed to compensate for a linear affect on the resulting values due to a deviation of the RMS output voltage from the nominal value (nominal value is 120V in this simulation). Further dividing the result above by a factor equal to "(actual RMS of Vout/nominal RMS of Vout)" will correct for this linear affect.

A computation was done for the last 8000 samples (2 cycles at 60 Hz) of the data to reduce the effect of any startup transient. Numerical results obtained were as follows, where:

Ires=RMS resistive-load 60 Hz output current component (amperes)
Iind=RMS inductive-load 60 Hz output current component (amperes)

Actual RMS of Vout was held to 120+/−1 v by adjusting Vdc.

R1=0.002 ohm
Ires=6 Iind=0 result=−0.000010 (0.000435)
Ires=6 Iind=6 result=0.000002 (0.000087)
Ires=12 Iind=0 result=0.000002 (0.000087)
Ires=12 Iind=12 result=0.000011 (0.000483)
R1=0.1 ohm
Ires=6 Iind=0 result=0.002348 (0.100964)
Ires=6 Iind=6 result=0.002278 (0.099093)
Ires=12 Iind=0 result=0.002318 (0.100833)
Ires=12 Iind=12 result=0.002291 (0.099659)
R1=0.2 ohm
Ires=6 Iind=0 result=0.004717 (0.205190)
Ires=6 Iind=6 result=0.004551 (0.197969)
Ires=12 Iind=0 result=0.004744 (0.206364)
Ires=12 Iind=12 result=0.004585 (0.199448)

Raw values are given in the third column. These values may be multiplied by a constant factor (43.5 was used in this simulation) to give the values in parentheses, which are estimates of resistance R1 of the link capacitor 82 in ohms.

The simulation described above is merely an example and in no way limits the principles of the current disclosure.

Figure 8:
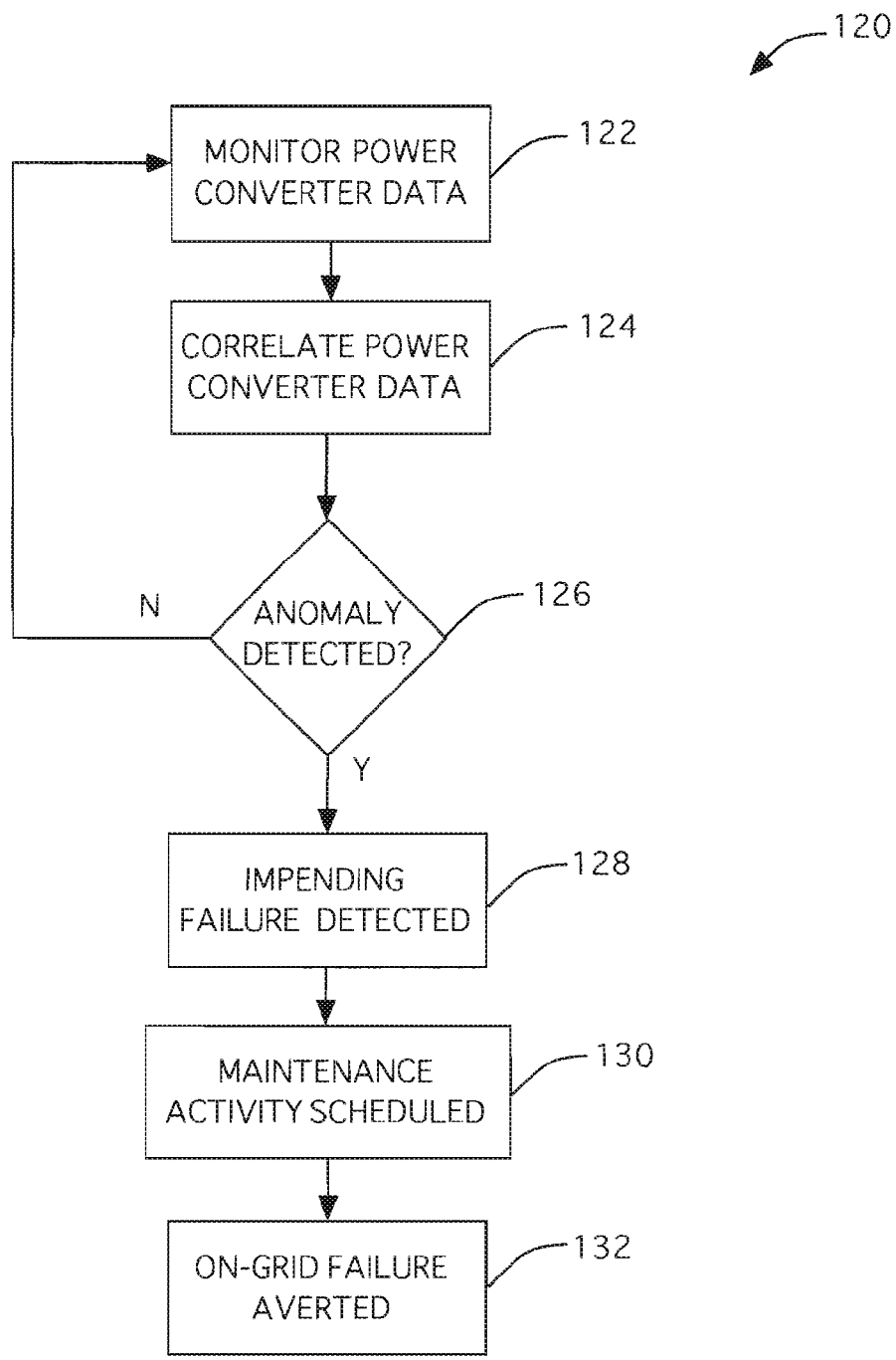
FIG. 8 is a representative flow chart of a method for measuring integrity of power converter.

FIG. 8, a representatively illustrates a method 120 for measuring integrity of a power converter. The method may be used with the power conversion systems 10, 20, or the method may be used with other power conversion systems in keeping with the principles of this disclosure.

In step 122, data Vin, Vout, Iin, Iout may be monitored for the inputs and outputs of the power converter 14. This data is provided to step 124 where the data may be correlated to identify degradation in performance of the power converter 14. The correlation may determine/detect an anomaly in the data. In step 126 a decision is made as to whether or not an anomaly is detected. If so, then proceed on to step 128. If not, then proceed back to step 122 and begin process again.

In step 128, the type of anomaly may be determined to be a change in the ESR values 72, an oscillation the ESR value, etc. The anomaly may be analyzed in step 128 to identify if the anomaly and determine the characteristics of an impending failure. Once the impending failure is detected/determined, then a maintenance activity 130 may be scheduled (e.g. initiated by sending a command to an operator or to an automated maintenance system) to repair or replace the component that has been determined to be a culprit of the impending failure. Step 132 represents the successful completion of the maintenance activity, thus averting the potential failure of the power converter 14 while the converter is outputting power to the power grid 30.

It is to be understood that the various embodiments of the present disclosure described herein may be utilized in various orientations and in various configurations, without departing from the principles of the present disclosure. The embodiments are described merely as examples of useful applications of the principles of the disclosure, which is not limited to any specific details of these embodiments.

Of course, a person skilled in the art would, upon a careful consideration of the above description of representative embodiments of the disclosure, readily appreciate that many modifications, additions, substitutions, deletions, and other changes may be made to the specific embodiments, and such changes are contemplated by the principles of the present disclosure. Accordingly, the foregoing detailed description is to be clearly understood as being given by way of illustration and example only, the spirit and scope of the present invention being limited solely by the appended claims and their equivalents.

What is claimed is:

1. A method of measuring integrity of a pulse-width modulated power converter, the method comprising the steps of:
   receiving power from a power source at an input of the pulse-width modulated power converter;
   outputting power from an output of the pulse-width modulated power converter to a power grid;
   sensing an input current of the pulse-width modulated power converter via an input current sensor coupled to the input of the power converter;
   sensing an output current of the pulse-width modulated power converter via an output current sensor coupled to the output of the power converter;
   transmitting the sensed input and output current data to a controller;
   the controller receiving the sensed input and output current data and calculating an equivalent series resistance for a link capacitor of the power converter based on the sensed input and output current data, thereby identifying a degradation in performance of the power converter;
   connecting the output of the pulse-width modulated power converter in parallel with an output of one or more additional pulse-width modulated power converters; and
   continuing to measure an individual integrity of the pulse-width modulated power converter during and/or after the connecting,
   wherein the individual integrity measurement is substantially unaffected with the output of the pulse-width modulated power converter being connected in parallel with the one or more additional pulse-width modulated power converters.

2. The method of claim 1, wherein the calculating includes determining an anomaly in the equivalent series resistance, thereby indicating an impending failure of the power converter.

3. The method of claim 2, further comprising initiating a maintenance activity as a result of the impending failure indication, thereby averting a failure of the power converter while the power converter is outputting power to the power grid.

4. The method of claim 2, wherein the anomaly is at least one of a change in the equivalent series resistance and an oscillation in the equivalent series resistance, thereby indicating the impending failure of a component of the power converter.

5. The method of claim 4, wherein the component is at least one of a control software program, an input capacitor, an insulated gate bipolar transistor, an inductor, a power MOSFET device, and a bridge switch.

6. The method of claim 1, wherein the calculating is performed while the power converter is operational, and wherein the calculating further comprises indicating an impending failure of the power converter.

7. The method of claim 1, further comprising recording the equivalent series resistance as a function of time.

8. The method of claim 1, wherein the calculating the equivalent series resistance includes compensating for at least one of temperature changes, output power factor, and output voltage changes.

9. The method of claim 1, wherein the calculating the equivalent series resistance includes averaging a sample-by-sample product of, a ripple of the input current, a first derivative of a ripple of the output current, and an alternating component of one of an output current and an output voltage.

10. A method of measuring integrity of a pulse-width modulated power converter, the method comprising the steps of:
    receiving power from a power source at an input of the pulse-width modulated power converter;
    outputting power from an output of the pulse-width modulated power converter to a power grid;
    sensing an input current of the pulse-width modulated power converter via an input current sensor coupled to an input of the power converter;
    sensing an output current of the pulse-width modulated power converter via an output current sensor coupled to an output of the power converter;
    transmitting the sensed input and output current data to a controller;
    the controller receiving the sensed input and output current data and calculating an equivalent series resistance for a link capacitor of the power converter based on the sensed input and output current data, thereby identifying a degradation in performance of the power converter;
    connecting the input of the pulse-width modulated power converter in parallel with an input of one or more additional pulse-width modulated power converters; and continuing to measure an individual integrity of the pulse-width modulated power converter during and/or after the connecting, wherein the individual integrity measurement is substantially unaffected while the input of the pulse-width modulated power converter is connected in parallel with the one or more additional pulse-width modulated power converters.

11. A system for measuring an integrity of a pulse-width modulated power converter, the system comprising:
the pulse-width modulated power converter, with an input that is configured to receive power from a power source and an output that is configured to output power to a power grid;
a first current sensor with a sampling frequency greater than 250 kHz is coupled to the input of the power converter and senses current at the input of the power converter, with the sensed input current data provided by the first sensor to a programmable controller;
a second current sensor with a sampling frequency greater than 250 kHz is coupled to the output of the power converter and senses current at the output of the power converter, with the sensed output current data provided by the second sensor to the programmable controller; and
the programmable controller, that is programmed with an integrity measuring algorithm, reads the sensed output and input current data from the sensors and calculates an equivalent series resistance for a link capacitor of the power converter based on the input and output current data received from the first and second current sensors,
wherein the programmable controller calculates the equivalent series resistance with the power converter in operation,
wherein the equivalent series resistance indicates an impending failure of the power converter and the impending failure indication is sent to an operator,
wherein the output of the pulse-width modulated power converter is connected in parallel to an output of one or more additional pulse-width modulated power converters, and
wherein the integrity measuring algorithm continues to measure an individual integrity of the pulse-width modulated power converter, and is substantially unaffected while the output of the pulse-width modulated power converter is connected in parallel with outputs of the one or more additional pulse-width modulated power converters.

12. The system of claim 11, wherein the integrity measuring algorithm indicates the impending failure when the equivalent series resistance is greater than a predetermined value.

13. The system of claim 11, wherein the equivalent series resistance is recorded as a function of time and generates an equivalent series resistance waveform.

14. The system of claim 13, wherein the integrity measuring algorithm predicts the impending failure when an oscillation is detected in the equivalent series resistance waveform.

15. The system of claim 11, wherein the integrity measuring algorithm includes an average of a sample-by-sample product of, a ripple of the input current, a first derivative of a ripple of the output current, and an alternating component of one of an output current and an output voltage.

16. A system for measuring an integrity of a pulse-width modulated power converter, the system comprising:
the pulse-width modulated power converter, with an input that is configured to receive power from a power source and an output that is configured to output power to a power grid;
a first current sensor with a sampling frequency greater than 250 kHz is coupled to the input of the power converter and senses current at the input of the power converter, with the sensed input current data provided by the first sensor to a programmable controller;
a second current sensor with a sampling frequency greater than 250 kHz is coupled to the output of the power converter and senses current at the output of the power converter, with the sensed output current data provided by the second sensor to the programmable controller; and
the programmable controller, that is programmed with an integrity measuring algorithm, reads the sensed output and input current data from the sensors and calculates an equivalent series resistance for a link capacitor of the power converter based on the input and output current data received from the first and second current sensors,
wherein the programmable controller calculates the equivalent series resistance with the power converter in operation,
wherein the equivalent series resistance indicates an impending failure of the power converter and the impending failure indication is sent to an operator,
wherein the input of the pulse-width modulated power converter is connected in parallel to an input of one or more additional pulse-width modulated power converters,
wherein the integrity measuring algorithm continues to measure an individual integrity of the pulse-width modulated power converter, and is substantially unaffected with the input of the pulse-width modulated power converter being connected in parallel with inputs of the one or more additional pulse-width modulated power converters.

17. A method of detecting a degraded performance of a pulse-width modulated power converter, the method comprising:
receiving power from a power source at an input of a first pulse-width modulated power converter;
outputting power from an output of the first pulse-width modulated power converter to a power grid;
sensing a first input current supplied to the first pulse-width modulated power converter via an input current sensor coupled to the input of the first power converter;
sensing a first output current of the first power converter via an output current sensor coupled to the output of the first power converter;
transmitting the sensed input and output current data to a first controller;
the first controller extracting a first ripple component from the first sensed input current data;
the first controller extracting a second ripple component from the first sensed output current data;
the first controller calculating a first equivalent series resistance for a link capacitor of the first power converter based on the first and second ripple components; and
the first controller determining a degradation in performance of the first power converter based on the first equivalent series resistance.

18. The method of claim 17, wherein the calculating of the first equivalent series resistance is further based on an alternating component of the first output current.

19. The method of claim 17, wherein the calculating of the first equivalent series resistance is further based on an alternating component of an output voltage of the first power converter.

20. The method of claim 19, further comprising calculating a compensated equivalent series resistance based on the first equivalent series resistance and an average power factor between the first output current and the first output voltage.

21. The method of claim 17, wherein the determining further comprises detecting an oscillation in the first equivalent resistance which indicates the degradation in the performance of the first power converter.

22. The method of claim 17, further comprising:
sensing a second input current supplied to a second pulse-width modulated power converter, with outputs of the first and second power converters being connected in parallel;
extracting a third ripple component of the second input current;
sensing a second output current of the second power converter;
extracting a fourth ripple component of the second output current;
a second controller calculating a second equivalent series resistance of a link capacitor of the second power converter based on the third and fourth ripple components; and
determining a degradation in performance of at least one of the first and second power converters based on a comparison of the first and second equivalent series resistances.

23. The method of claim 22, wherein the determining is performed while the first and second power converters are connected to the power grid.

24. The method of claim 17, further comprising initiating a maintenance activity as a result of the performance degradation, thereby averting a failure of the power converter while the power converter is outputting power to the power grid.

25. The method of claim 17, wherein calculating the first equivalent series resistance further comprises averaging a sample-by-sample product of, the first ripple component, a derivative of the second ripple component, and an alternating component of one of the first output current and an output voltage of the first power converter.

* * * * *